United States Patent
Chua et al.

(10) Patent No.: US 7,243,329 B2
(45) Date of Patent: Jul. 10, 2007

(54) APPLICATION-SPECIFIC INTEGRATED CIRCUIT EQUIVALENTS OF PROGRAMMABLE LOGIC AND ASSOCIATED METHODS

(75) Inventors: Kar Keng Chua, Penang (MY); Sammy Cheung, South San Francisco, CA (US)

(73) Assignee: Altera Corporation, San Jose, CA (US)

( * ) Notice: Subject to any disclaimer, the term of this patent is extended or adjusted under 35 U.S.C. 154(b) by 261 days.

(21) Appl. No.: 10/884,460

(22) Filed: Jul. 2, 2004

(65) Prior Publication Data

US 2006/0001444 A1    Jan. 5, 2006

(51) Int. Cl.
G06F 17/50    (2006.01)
G06F 7/38    (2006.01)
H01L 25/00    (2006.01)

(52) U.S. Cl. .............................. 716/16; 716/17; 716/18; 326/39; 326/41

(58) Field of Classification Search .................... 716/1, 716/16–18; 326/37–41
See application file for complete search history.

(56) References Cited

U.S. PATENT DOCUMENTS

| | | | |
|---|---|---|---|
| 5,825,202 A | 10/1998 | Tavana et al. | |
| 5,841,295 A * | 11/1998 | Kaviani | 326/39 |
| 5,874,834 A | 2/1999 | New | |
| 6,091,262 A | 7/2000 | New | |
| 6,094,065 A | 7/2000 | Tavana et al. | |
| 6,242,945 B1 | 6/2001 | New | |
| 6,490,707 B1 | 12/2002 | Baxter | |
| 6,515,509 B1 | 2/2003 | Baxter | |
| 6,526,563 B1 | 2/2003 | Baxter | |
| 6,769,107 B1 * | 7/2004 | Watkins | 716/16 |
| 2002/0004931 A1 * | 1/2002 | Stralen | 716/18 |
| 2004/0111691 A1 | 6/2004 | Tan et al. | |
| 2004/0261052 A1 | 12/2004 | Perry et al. | |
| 2005/0071787 A1 * | 3/2005 | Koga et al. | 716/1 |
| 2005/0146352 A1 * | 7/2005 | Madurawe | 326/41 |

OTHER PUBLICATIONS

U.S. Appl. No. 10/861,585, filed Jun. 4, 2004, Foo.
U.S. Appl. No. 10/879,256, filed Jun. 23, 2004, Perry et al.

* cited by examiner

*Primary Examiner*—Paul Dinh
(74) *Attorney, Agent, or Firm*—Fish & Neave IP Group of Ropes & Gray LLP; Robert R. Jackson

(57) ABSTRACT

Providing ASIC equivalents of FPGAs is facilitated and made more efficient and economical by using an ASIC architecture including a plurality of so-called hybrid logic elements ("HLEs"), each of which can provide a portion of the full functionality of an FPGA logic element ("LE"). The functionality of each FPGA LE implementing a user's logic design can be mapped to one or more HLEs without re-synthesis of the user's logic. Only as many HLEs as are necessary are used to perform the functions of each LE. The one-for-one equivalence between each LE and either (1) one HLE or (2) a group of HLEs facilitates mapping (without re-synthesis) in either direction between FPGA and ASIC designs.

18 Claims, 14 Drawing Sheets

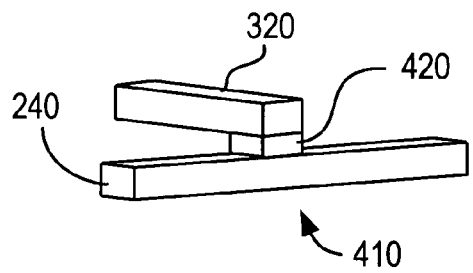 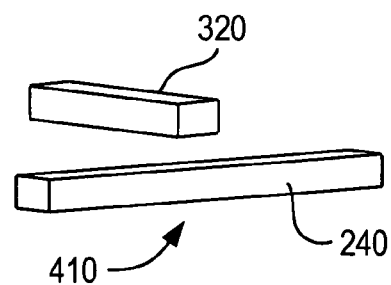
FIG. 4  FIG. 5
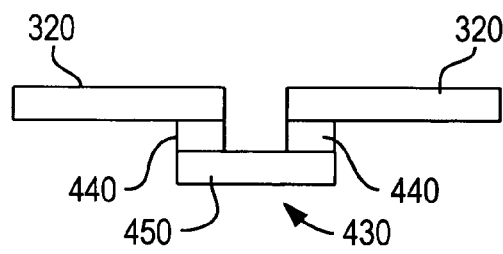 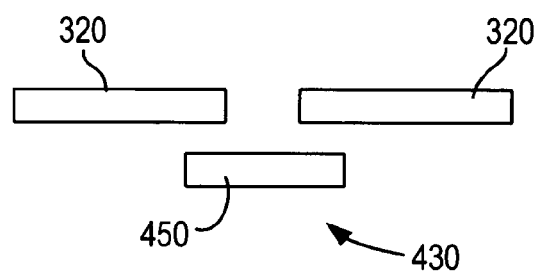
FIG. 6  FIG. 7
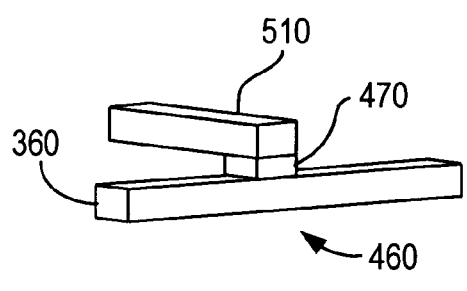 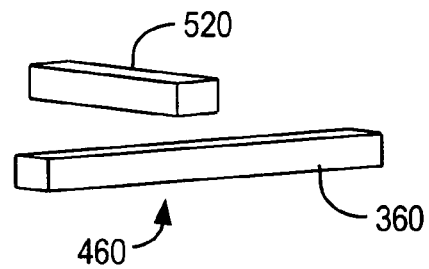
FIG. 8  FIG. 9

Y = A XOR B

Y = AC' + BC

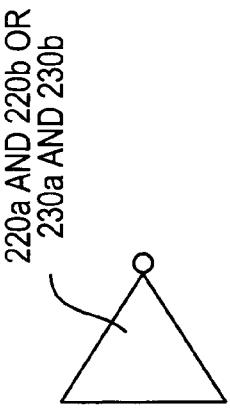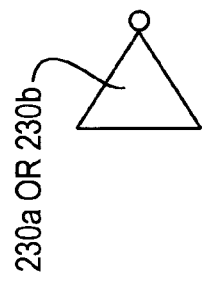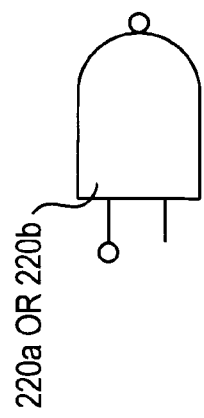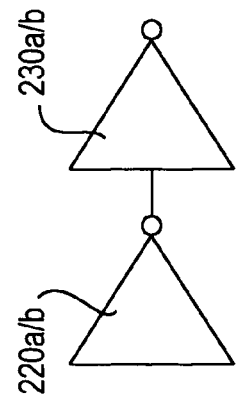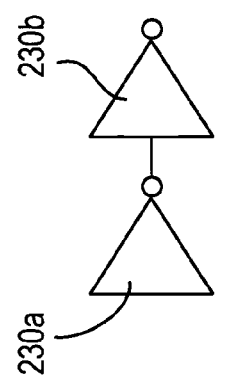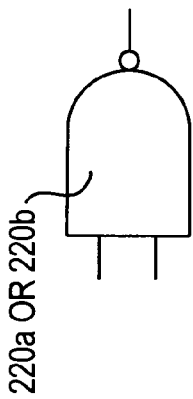

APPLICATION-SPECIFIC INTEGRATED CIRCUIT EQUIVALENTS OF PROGRAMMABLE LOGIC AND ASSOCIATED METHODS

BACKGROUND OF THE INVENTION

This invention relates to circuitry for application-specific integrated circuits ("ASICs") that can be used as equivalents of or substitutes for programmable logic circuitry (PLDs or FPGAs). The invention also relates to transferring designs for particular uses of an ASIC or a PLD (or FPGA) between those two types of devices so that device interchangeability is achieved.

A typical programmable logic device ("PLD") or field-programmable gate array ("FPGA") includes many logic elements ("LEs") of a fixed size. (For convenience herein, the term FPGA is used as a generic term for PLDs and FPGAs.) For example, an FPGA LE may include a four-input look-up table ("LUT"), a register, and some routing circuitry that allows the register to be either used (e.g., to register the output of the LUT) if sequential logic or operation is desired, or to be bypassed by the LUT output if only combinational or combinatorial logic or operation is desired. An FPGA LE may also have other features or capabilities, but the foregoing example will be sufficiently illustrative. In addition to many LEs, an FPGA also typically has programmable routing circuitry for conveying signals to, from, and/or between the LEs in any of many different ways so that very complex and/or extensive logic or logic-type operations can be performed by combining or otherwise using multiple LEs. Also in addition to LEs, an FPGA may have other types of circuitry, such as input/output ("I/O") circuitry, blocks of memory, microprocessors, special-purpose circuitry such as digital signal processing ("DSP") blocks, high-speed serial interface ("HSSI") blocks, etc. These other types of circuitry may also be interconnectable to one another (and to the LEs) via the above-mentioned programmable routing circuitry.

FPGAs have many advantages that are well known to those skilled in the art. In some instances, however, it may be desired to have an ASIC equivalent of an FPGA design so that cost can be reduced in a high-volume application. For example, a design may start out in an FPGA. But after that design has been sufficiently proven and has reached sufficiently high volume, substituting an ASIC equivalent can be very cost-effective.

One known approach to providing ASIC equivalents to FPGAs employs an ASIC architecture having the same basic organization of LEs as the starting FPGA. For example, if the FPGA includes an array of LEs, each of which has a four-input LUT ("4-LUT") and a register, then the ASIC has a similar array of LEs including 4-LUTs and registers. Certain layers in the ASIC are then customized to a particular user's design to effectively "program" the LEs and to provide the required interconnection routing among the LEs.

The foregoing approach to providing ASIC equivalents of FPGAs has many advantages. However, improvements are always sought. For example, most user designs do not make use of all the circuitry on an FPGA. Some fraction of the FPGA circuitry is generally unused. A 4-LUT may only be used to provide a two- or three-input function. Or either the LUTs or the registers (but not both) in some LEs may be used. In any of these cases, substantial amounts of the circuitry in the less-than-fully-utilized LEs is effectively wasted. If the same basic LE structure forms the basis for the equivalent ASIC, the same waste will be replicated in the ASIC.

SUMMARY OF THE INVENTION

In view of the foregoing, an ASIC architecture in accordance with this invention includes logic elements that are not the same as the LEs in an equivalent FPGA. These ASIC logic elements are referred to herein as hybrid logic elements ("HLEs"). Each HLE may include a relatively small, general-purpose, combinatorial logic component (e.g., a one-input LUT or "1-LUT"), a relatively small array of logic gates (e.g., two two-input NAND gates), and some associated interconnection or routing resources. The amount of operational circuitry in an HLE (e.g., the 1-LUT and the NAND gates) is much less than the amount of operational circuitry in a related FPGA LE. At some least aspects of the routing resources in an HLE are programmable (e.g., mask programmable using vias) for such purposes as making input connections to the HLE, output connections from the HLE, and internal connections within the HLE. For some relatively under-utilized FPGA LEs, one ASIC HLE can perform the functions of the LE. If an LE has greater utilization, then several adjacent (or at least nearby) HLEs may be needed to equivalently perform the LE's functions. The routing resources of HLEs facilitate interconnecting adjacent (or nearby) HLEs that need to be put together to perform any LE's functions. In any case, only as many HLEs as are necessary to perform an LE's functions are used to provide an equivalent of that LE. Because many LEs in most designs are not fully utilized, the number of HLEs provided on an ASIC for use as equivalent to an FPGA can be significantly less than the number of HLEs that would be required if all LEs were fully utilized. This is a significant ASIC size reduction as compared to an ASIC that uses a fully featured LE for each FPGA LE.

At least to a large extent, there is preferably a one-for-one correspondence between each LE and the equivalent HLE or group of HLEs. This facilitates converting an FPGA design to the equivalent ASIC, and also vice versa, without re-synthesis of the user's logic. Avoiding such re-synthesis can save time and cost, and it also gives greater assurance that the ASIC and FPGA equivalents will function substantially identically and without fault (assuming that either the FPGA or the ASIC has been proven to function properly).

Further features of the invention, its nature and various advantages, will be more apparent from the accompanying drawings and the following detailed description.

BRIEF DESCRIPTION OF THE DRAWINGS

FIGS. 4–9 are simplified perspective or elevational views of illustrative programmable interconnect structures for ASICs in accordance with the invention.

FIGS. 21a–c, 22a–c, and 23 are schematic block diagrams showing illustrative uses of certain possible components of HLEs in accordance with the invention.

DETAILED DESCRIPTION

Figure 1:
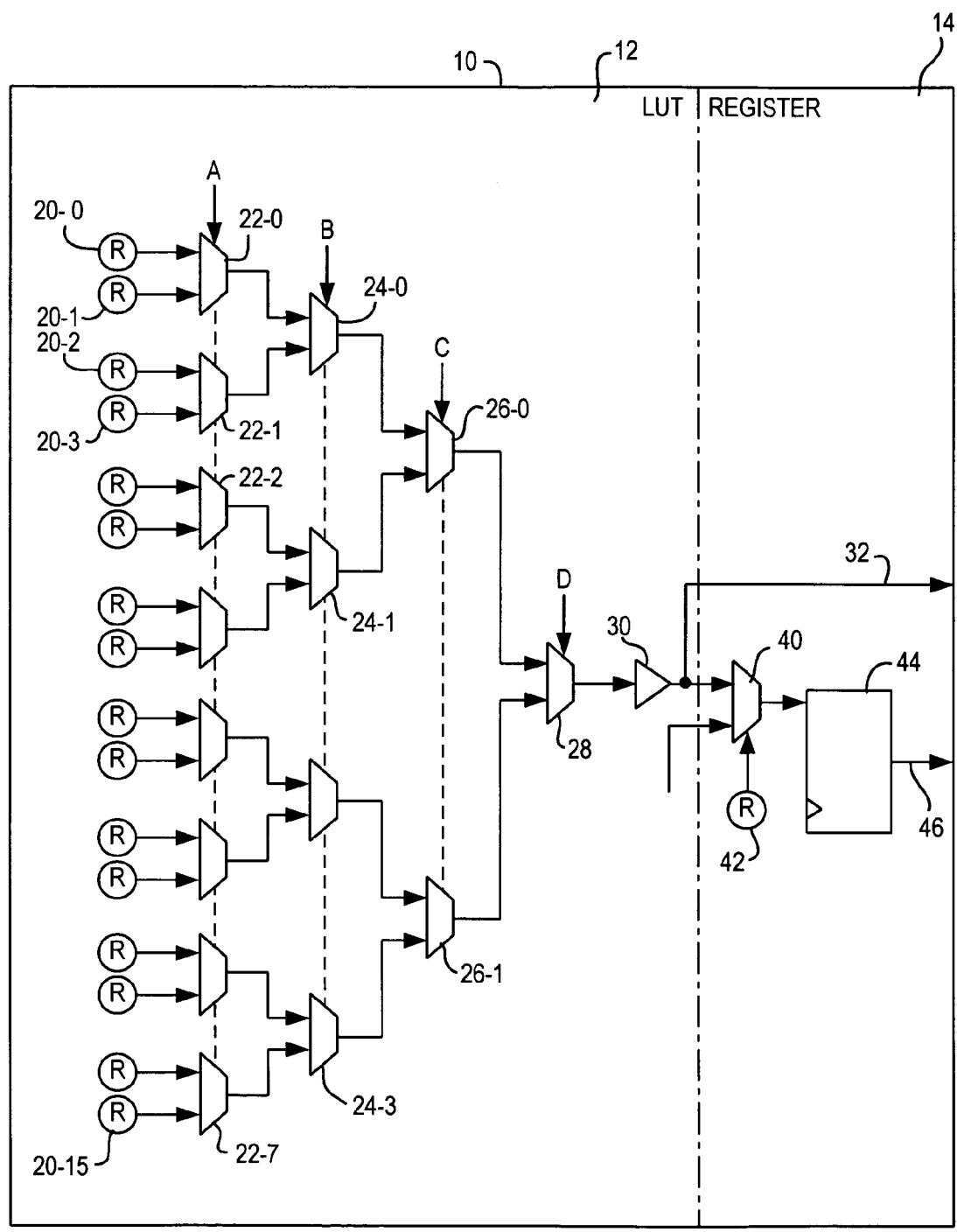
FIG. 1 is a simplified schematic block diagram of an illustrative, known, FPGA LE.

An illustrative, known, FPGA LE 10 is shown in FIG. 1. LE 10 includes a 4-LUT portion 12 and a register portion 14. 4-LUT portion 12 includes 16 programmable memory (e.g., RAM) cells 20-0 through 20-15. The outputs of RAM cells 20 are applied, in respective pairs, to the inputs of eight two-input multiplexers ("muxes") 22-0 through 22-7. 4-LUT input A controls which of its inputs (from RAM cells 20) each of muxes 22 selects to be its output. For example, if input A is logic 1, each of muxes 22 selects its upper input to be its output. If input A is logic 0, each of muxes 22 selects its lower input to be its output. The outputs of muxes 22 are applied, in respective pairs, to the inputs of four two-input muxes 24. 4-LUT input B controls which of its inputs each of muxes 24 selects as its output. Again, if B is logic 1, muxes 24 select their upper inputs to output. If B is logic 0, muxes 24 select their lower inputs to output. The outputs of muxes 24 are applied, in respective pairs, to the inputs of two two-input muxes 26. 4-LUT input C controls which of its inputs each of muxes 26 selects as its output. The logic is similar to that for muxes 22 and 24. The outputs of muxes 26 are applied to two-input mux 28. 4-LUT input D controls which of its inputs mux 28 outputs (following the same logic as for inputs A–C).

The output signal of mux 30 is applied to driver circuit 30. The output of driver 30 is one output (the combinatorial output 32) of LE 10. The output of driver 30 is also applied to one input terminal of mux 40. The other input to mux 40 is another input to LE 10. Mux 40 is controllable (e.g., by programmable RAM cell 42) to select either of its inputs for application to the data input terminal of register 44. This arrangement allows register 44 to be used to register another signal if it is not needed to register the output of LUT 12. The output of register 44 is the registered output 46 of LE 10.

Figure 2:
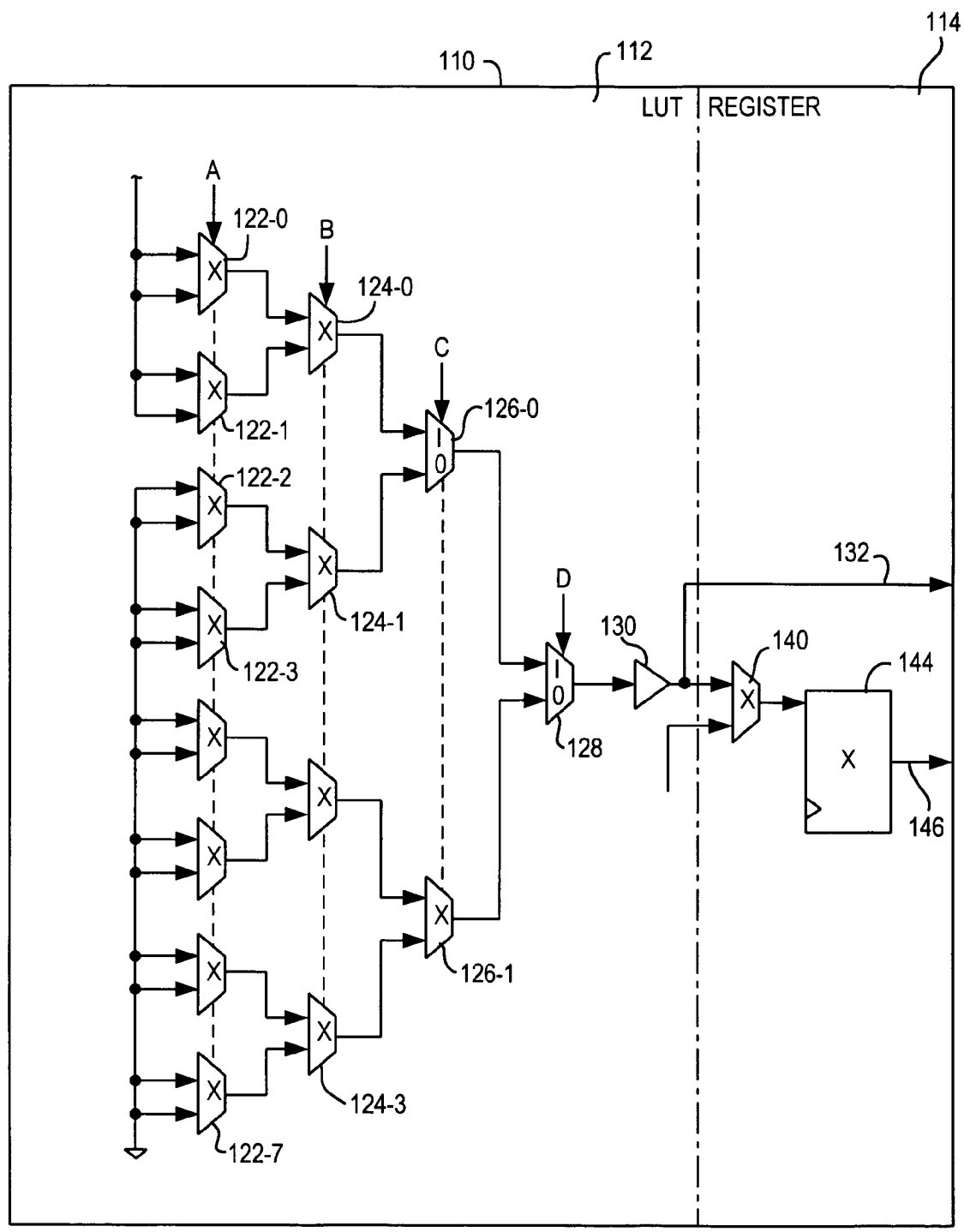
FIG. 2 is a simplified schematic block diagram of an illustrative, known, ASIC equivalent of an FPGA LE.

FIG. 2 shows a possible, known, ASIC equivalent of LE 10 configured as a two-input AND gate (without registration of the output). Elements in FIG. 2 that are similar to elements in FIG. 1 have reference numbers that are increased by 100 from their FIG. 1 reference numbers. Thus in ASIC LE 110, inputs C and D are ANDed to produce the unregistered LE output 132. The inputs of muxes 122-0 and 122-1 are tied to logic 1. The inputs of the other muxes 122 are tied to logic 0. This has the effect of rendering inputs A and B "don't care" inputs. Only inputs C and D can affect the output, and they do so in a way that the output is the AND of C and D. This use of LE 110 means that the elements in which an X has been placed are effectively unused. In particular, all of elements 122, 124, 126-1, 140, and 144 are effectively unused. It is therefore a considerable waste for all of these elements to be included in the ASIC circuitry that is provided to make an equivalent of an FPGA LE 10 having such relatively low utilization. Logic reduction (see, for example, Foo U.S. Pat. No. 7,081,772) can be used to reduce the amount of circuitry that must be provided in ASIC LE 110. For example, the first level of muxing (122) can be eliminated by selectively using input A and its complement as the inputs to the next level of muxing (124). Nevertheless, a significant amount of the circuitry of even such a reduced ASIC LE 110 is wasted whenever an underutilized FPGA LE 10 is being implemented.

Figure 3:
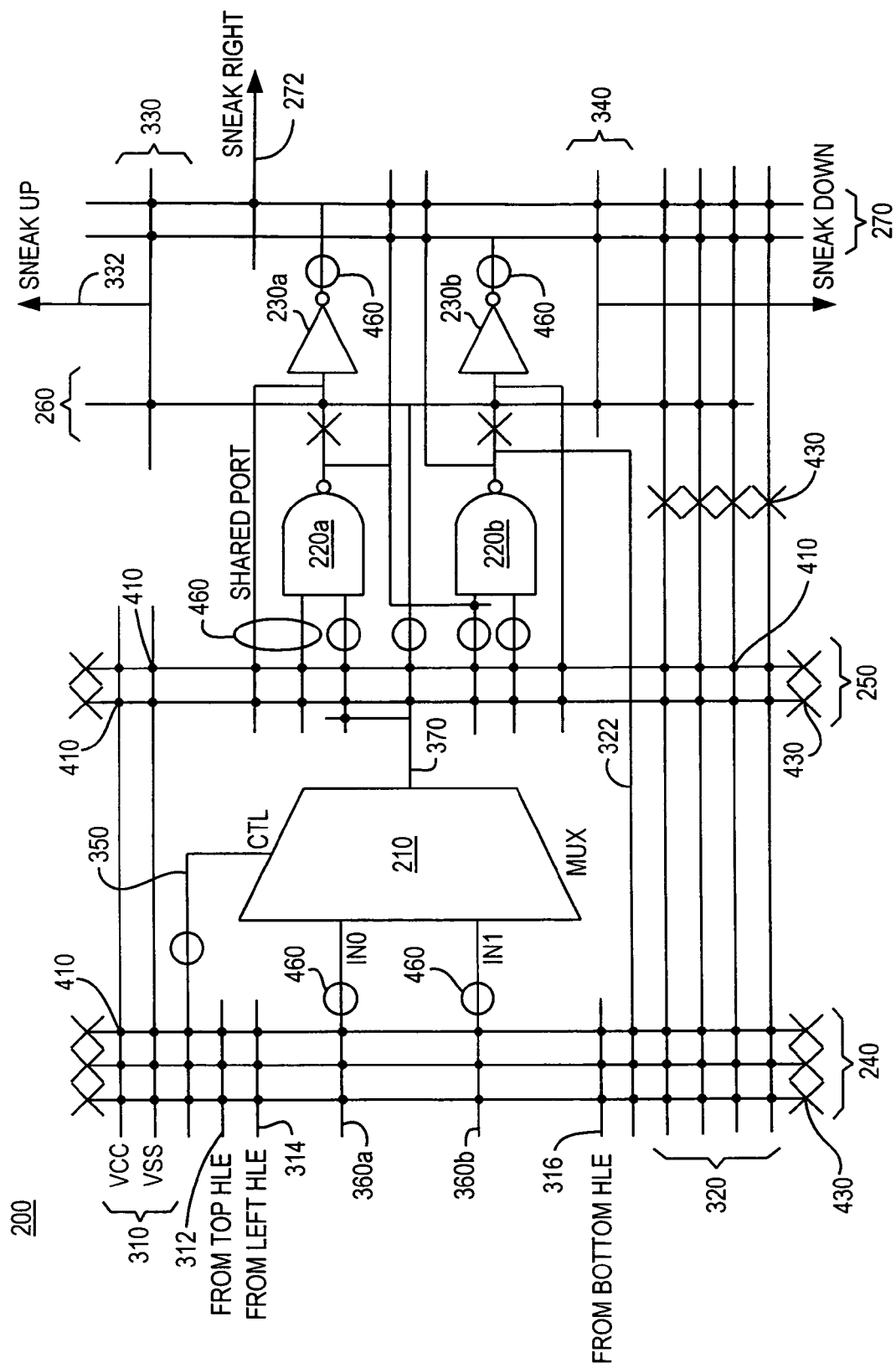
FIG. 3 is a simplified schematic block diagram of an illustrative ASIC HLE in accordance with this invention.

FIG. 3 shows an illustrative embodiment of a so-called hybrid logic element ("HLE") 200 constructed in accordance with this invention for use, either alone or in multiples, in providing less wasteful ASIC equivalents of FPGA LEs. Although the particular HLE 200 construction shown in FIG. 3 will now be described in some detail, it is emphasized here as a preliminary point that this embodiment is only one example, and that many variations of this construction are possible without departing from the scope and spirit of the invention.

HLE 200 includes two-input multiplexer ("mux") 210, two two-input NAND gates 220a and 220b, two inverting buffers or drivers 230a and 230b, and interconnection resources that are described more fully in the next several sentences. The interconnection resources shown in FIG. 3 include a plurality of vertical conductors 240 upstream from mux 210, a plurality of vertical conductors 250 between mux 210 and NAND gates 220, one (or more) vertical conductor(s) 260 between NAND gates 220 and drivers 230, and a plurality of vertical conductors 270 downstream from drivers 230. The interconnection resources shown in FIG. 3 also include several horizontal conductors (e.g., conductors 310, 320, 330, and 340). Conductors 240, 250, 260, 270, 310, 320, 330, and 340 are relatively general-purpose conductors, by which it is meant that they can be used to make any of several different links between any of several different sources and any of several different destinations. In addition to these relatively general-purpose conductors, HLE 200 includes several more-specialized conductors. For example, conductor 350 is dedicated to supplying the control input to mux 210 (although there can be any of several sources for that control input signal, as will be described in more detail below, and conductor 350 can also be put to other use if desired). As another example, conductors 360a and 360b are dedicated to supplying the two selectable inputs to mux 210 (again from any of several possible sources, and again with additional possible use if desired). As still another example, conductor 370 is dedicated to conveying the output of mux 210, although that output can go to any of several destinations. Although some conductors have been described as relatively general-purpose, and other conductors are described as more specialized, these descriptive concepts are employed only for convenience. They are not intended to be limiting. Nor is there any definite distinction between the two, or any necessity for both types to be present.

The small solid dots 410 at conductor intersections in FIG. 3 represent locations at which connections between the intersecting conductors can be made or not made as desired. These connections are therefore programmable. In the preferred embodiments these connections are mask-programmable using vias that are either included or not included in one or more layers between the layers containing the intersecting conductors. (Although via programming is generally referred to herein, this is only an example, and any of several other programming technologies can be used instead if desired. Other examples of usable programming technologies are mentioned later in this specification.) FIG. 4 shows two intersecting conductors 240 and 320 in respective different metal layers on an integrated circuit device that includes HLE 200. In FIG. 4 these conductors are electrically connected to one another by a via 420 through an insulating layer between the two metal layers. The same structure is shown again in FIG. 5 without a via through the insulating layer. Accordingly, in FIG. 5 conductors 240 and 320 are not connected to one another. (Whether conductor 240 or 320 is in the higher or lower metal layer is arbitrary and a matter of design choice.)

The Xs 430 in FIG. 3 represent locations at which conductor segments can be programmably connected to one another or not as desired. The same technology choices as described above for small solid dots 410 are suitable for connections 430. For example, FIG. 6 shows two segments of representative conductor 320 connected by mask-programmable vias 440 to bridging conductor 450. Accordingly, these two segments of conductor 320 are electrically connected to one another by way of vias 440 and bridging conductor 450. FIG. 7 shows the same structure but without vias 440. Accordingly, in FIG. 7 conductor segments are not connected to one another. Rather, they are electrically insulated from one another.

The large open circles or ovals 460 in FIG. 3 represent locations at which the conductors having those circles or ovals can be programmably connected to what may be called a higher level of interconnection resources (not shown in FIG. 3) on a device that includes HLE 200. This higher level of interconnection resources may be used for such purposes as conveying signals between components (e.g., HLEs, device input/output ("I/O") ports, etc.) that may not be adjacent or relatively close to one another. (The phrase "higher level" does not necessarily mean a physically higher level, but only a hierarchically higher level.) Programmable connections 460 can be made in any of the ways described above (e.g., for programmable connections 410). For example, FIG. 8 shows representative conductor 360 connected to higher level conductor 510 by mask-programmable via 470. FIG. 9 shows the same structural location 460 again, but now with no connection between conductor 360 and higher level conductor 520.

In FIG. 3 conductors shown extending along different axes always connect to one another if one of these conductors is shown ending at the other conductor (or if both conductors are shown ending at the other conductor). Conductors shown crossing one another without a small solid dot at the intersection are preferably not connectable to one another at the intersection.

Certain conductors are shown in FIG. 3 as having particular external connections. Thus the top-most conductor 310 is shown as always connected to VCC (e.g., logic 1). The next-to-top-most conductor 310 in FIG. 3 is shown as always connected to VSS (e.g., logic 0). Conductors 312, 314, and 316 are shown as input connections from other adjacent HLEs above, to the left, and below the depicted HLE. Conductor 332 provides the input 316 to the HLE above the depicted HLE. Conductor 272 provides the input 314 to the HLE to the right of the depicted HLE. Conductor 342 provides the input 312 to the HLE below the depicted HLE. These so-called "sneak" connections between adjacent or nearby HLEs can be an always-provided, fixed part of the interconnection resources of the device. Whether they are actually used (and how they are used) can be programmable as a result of how the programmable connections 410 at one or both ends of the sneak connections are programmed.

The Xs 430 at the depicted ends of conductors like 240 and 250 represent locations at which those conductors can be programmably connected to similar conductors in other HLEs adjacent to the depicted HLE.

One HLE 200, or a relatively small but suitable number of adjacent or nearby HLEs 200, can be used to perform any function or functions that can be performed by an FPGA LE such as 10 in FIG. 1. In each case, only as many HLEs as are required to perform the LE's function(s) are employed to produce an ASIC equivalent of the FPGA LE.

Figure 10:
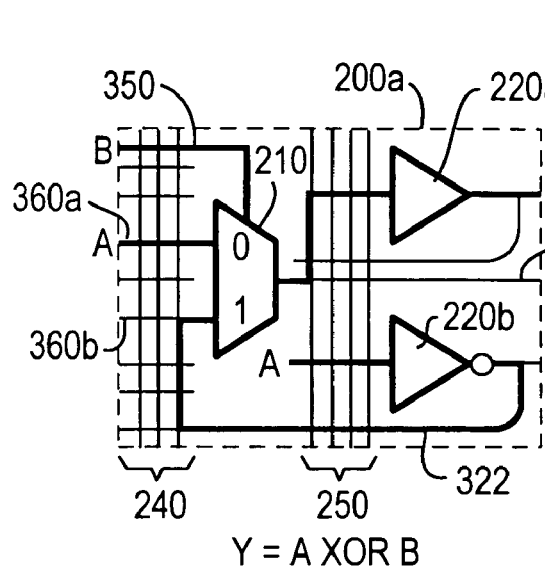
FIG. 10 is a simplified schematic block diagram of an illustrative, programmed, ASIC HLE in accordance with the invention.

FIG. 10 shows a somewhat simpler form of HLE 200a (or at least a simplified representation of HLE 200 (FIG. 3)) being used to provide an output Y, which is A XOR B. The interconnection resources of HLE 200a that are actually in use in this example are drawn using much heavier (thicker) lines. Other interconnection resources that are present but not in use in this example are represented by the lighter (thinner) lines. Input A is applied to the upper input terminal of mux 210. For example, input A may come into HLE 200a by way of the programmable connection 460 (FIG. 3) shown on the corresponding mux input IN0 in FIG. 3. Thus input A may come in from a conductor (like 510 in FIG. 8) in the higher level interconnection circuitry of the device. Input A is also applied to both input terminals of NAND gate 220b in FIG. 3. This causes NAND gate 220b to operate as an inverter, as shown in FIG. 10. Again, these inputs of A may be by way of the programmable connections 460 to the left of NAND gate 220b in FIG. 3. The output of inverter 220b (FIG. 10) is fed back to the lower input of mux 210 (e.g., by way of conductor 322, a programmable connection 410 (FIG. 3) to one of vertical conductors 240, a portion of that vertical conductor, another programmable connection 410 to conductor 360b, and a portion of that conductor 360b).

Input B is applied to the control input of mux 210 by way of conductor 350. For example, input B may be applied to conductor 350 by way of the programmable connection 460 shown on that conductor in FIG. 3. Thus input B may come into HLE 200a from the higher level interconnection circuitry of the device. When input B is logic 0, mux 210 outputs the signal on the upper one of its two selectable input leads (i.e., conductor 360a). When input B is logic 1, mux 210 outputs the signal on the lower one of its two selectable input leads (i.e., conductor 360b). Accordingly, the output signal of mux 210 is A XOR B.

The output signal of mux 210 is applied to both inputs of NAND gate 220a (FIG. 3), which therefore acts as an inverter. The output of NAND gate 220a is applied to inverting driver 230a, which again inverts the signal. Accordingly, the combined effect of elements 220a and 230a, used in this way, is to provide a non-inverting output driver for the output signal of mux 210, i.e., Y (=A XOR B).

The routing of the mux 210 output signal to the two input terminals of NAND gate 220a can be by way of a portion of conductor 370, a programmable connection 410 (FIG. 3) from that conductor to one of vertical conductors 250, a portion of that vertical conductor 250, and two more programmable connections 410 from that conductor to the two inputs to NAND gate 220*a*. The Y output of driver 220*a*/230*a* can be connected into the higher level interconnection circuitry by way of the programmable connection 460 (FIG. 3) on the output lead of inverter 230*a*.

FIG. 10 thus shows one example of a logic function that can be performed in a single HLE with relatively little waste of resources. Performance of this function in an ASIC LE comparable to an FPGA LE (analogous to what is shown in FIGS. 1 and 2) would leave a substantial portion of the ASIC LE resources unused and therefore wasted (even with logic reduction of the type mentioned above toward the end of the discussion of FIG. 2). An HLE construction as shown herein provides a much less wasteful implementation.

Figure 11:
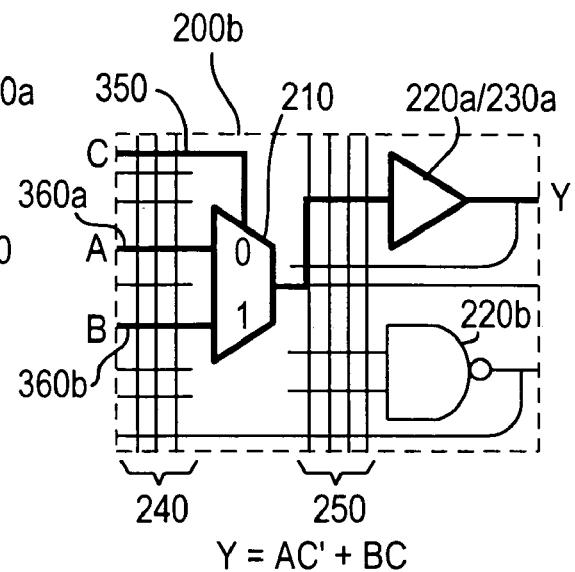
FIG. 11 is a simplified schematic block diagram of another illustrative, programmed, ASIC HLE in accordance with the invention.

FIG. 11 shows another example of a logic function that can be implemented in a single HLE 200*b* (again like HLE 200 in FIG. 3 or at least conceptually similar thereto). The function implemented in FIG. 11 is Y=(A AND C') OR (B AND C). Conductors and elements that are used in FIG. 11 are shown with heavier lines. Conductors and elements that are not used in FIG. 11 are shown with lighter lines. The manner in which signals are routed into, through, and out of HLE 200*b* will be apparent from the foregoing discussion and therefore will not require further detailed description.

Figure 12:
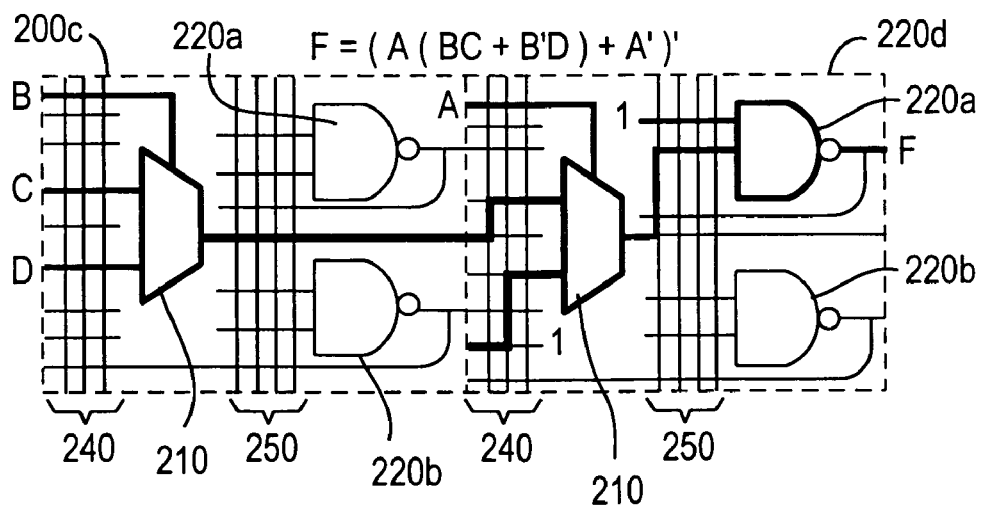
FIG. 12 is a simplified schematic block diagram of an illustrative, programmed, pair of ASIC HLEs in accordance with the invention.

FIG. 12 shows an example of a four-input combinational logic function implemented in two adjacent HLEs 200*c* and 200*b*, each of which can be like HLE 200 in FIG. 3 or at least conceptually similar thereto. The function implemented is F=(A(BC+B'D)+A')'. The elements and conductors used to implement this function are shown using heavier lines in FIG. 12. Unused elements and conductors are shown using lighter lines. FIG. 12 illustrates the use of a sneak connection to convey a signal from one HLE to another adjacent or nearby HLE. In this case the output signal of mux 210 in HLE 200*c* is conveyed to HLE 200*d* via a sneak connection like 272/314 in FIG. 3. (It will be apparent from FIG. 3 and what has been said earlier in this specification how the output of mux 210 can be routed to sneak right output 272, from there to sneak input 314 of the HLE to the right, and from that input to an input of the mux 210 in the HLE to the right.) FIG. 12 also illustrates the use of a VCC input (logic 1) to elements 210 and 220*a* in HLE 200*d*. This can be done using one of conductors 310 as shown in FIG. 3 and programmable routing (e.g., programmable connections 410) from that conductor to the desired inputs of element 210 and 220*a*.

FIG. 12 shows some additional interconnection between horizontally adjacent HLEs that is not shown (at least not explicitly) in FIG. 3. These are more extensive connections from each HLE to the HLE to the right. FIG. 3 may imply that only a sneak connection is available for such routing. But FIG. 12 shows three signals (the output of mux 210 and the outputs of NAND gates 220*a* and 220*b*) able to flow from each HLE to the HLE to the right, at the hierarchical level of the HLE routing resources. This additional, relatively direct, HLE-to-HLE routing is just one example of the many different ways it is possible to construct HLEs in accordance with the invention. Of course, if such additional direct connections were not provided at the HLE level, similar connections could be made using higher level interconnection circuitry. However, it is presently believed desirable to provide sufficient relatively direct, HLE-to-HLE routing capability (including sneak connections) to allow at least a substantial portion (preferably at least most) of the HLE-to-HLE connections that are needed by a group of HLEs performing the function(s) of any FPGA LE. The higher level routing can then be reserved for longer-distance interconnections.

Figure 13:
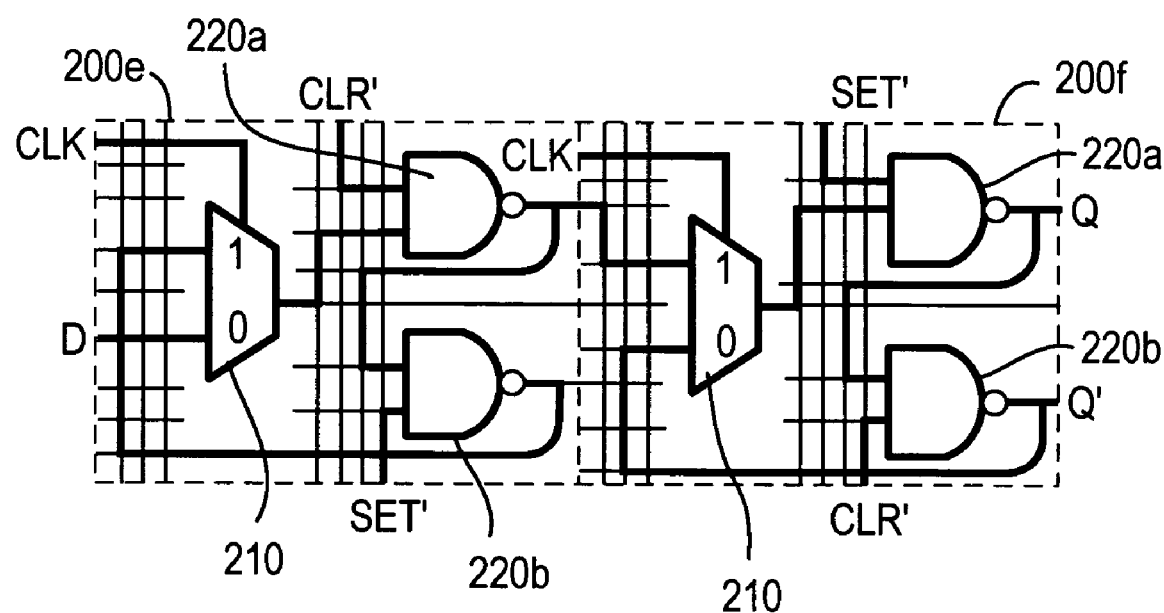
FIG. 13 is a simplified schematic block diagram of another illustrative, programmed, pair of ASIC HLEs in accordance with the invention.

FIG. 13 shows an example of use of two adjacent HLEs 200*e* and 200*f* to provide a flip-flop or register (one of the capabilities of a typical FPGA LE). Once again, each of HLEs 200*e* and 200*f* can be like (or at least conceptually similar to) HLE 200 in FIG. 3. Elements and conductors used to provide the flip-flop are shown with heavy lines in FIG. 13. Unused structure is shown in lighter lines. It will not be necessary to describe all of the connections shown in FIG. 13, or how those connections are achieved, because that information will be apparent from the FIG. and the earlier description. It will be sufficient to say that the signal D to be registered can come into HLE 200*e* by way of a programmable connection 460 (FIG. 3) from higher level interconnection circuitry of the device, or at a lower level from another adjacent or nearby HLE. The same is true for the clock signal CLK that clocks the flip-flop. (This signal is needed by both of HLEs 200*e* and 200*f*.) Alternatively, CLK could come into each HLE in a manner like that shown for VCC and VSS in FIG. 3. FIG. 13 shows CLR' and SET' signals coming into each HLE 200*e* and 200*f* by way of conductor 250 programmable connections 430 (FIG. 3) from similar conductors in adjacent HLEs above and below. Ultimately these signals may enter the HLE array the way signals like VCC and VSS are shown entering in FIG. 3, or by way of programmable connections 460 (FIG. 3) to higher level interconnection circuitry of the device. The registered outputs Q and Q' of the flip-flop can enter the higher level interconnection circuitry of the device by way of more programmable connections 460, or they can go to other adjacent or nearby HLEs by way of lower level connections.

Figure 14:
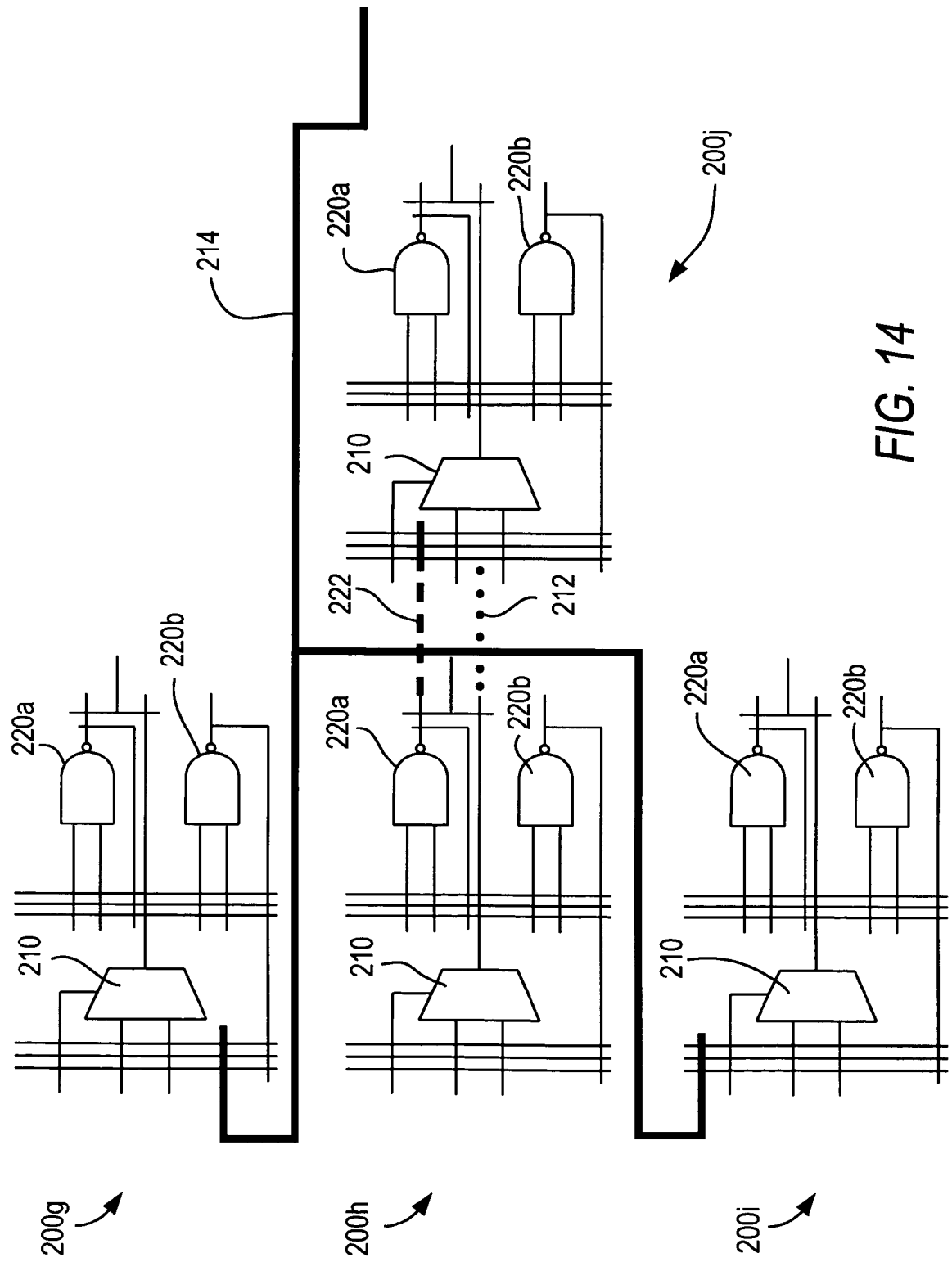
FIG. 14 is a simplified schematic block diagram of several illustrative ASIC HLEs with illustrative additional programmable interconnection circuitry in accordance with the invention.

FIG. 14 shows several adjacent HLEs 200*g*, 200*h*, 200*i*, and 200*j*, with emphasis on certain (but not necessarily all) relatively direct connection resources between HLEs. In the embodiment shown in FIG. 14 the inter-HLE interconnection resources include direct connection 222 (shown as a heavy dashed line) from the NAND gate 220*a* of HLE 200*h* to the HLE 200*j* to the right. Another direct connection shown in FIG. 14 is connection 212 (shown as a heavy dotted line) from the output of mux 210 in HLE 200*h* to the HLE 200*j* to the right. Still another direct connection shown is sneak connection network 214 (shown as a heavy solid line), which extends from a sneak output of HLE 200*h* to HLEs 200*g*, 200*i*, and yet another HLE (not shown) to the right of HLE 200*j*. In this embodiment, the sneak output is shown as programmably selectable from either conductor 212 or 222, but other sources for this signal are equally possible. All of the HLE-to-HLE connection resources emphasized in FIG. 14 (including the sneak connections) can be implemented in the same levels of metal as are used for intra-HLE connection resources, and therefore without recourse to the higher level interconnection circuitry that is typically used for longer-distance interconnections.

Figure 15:
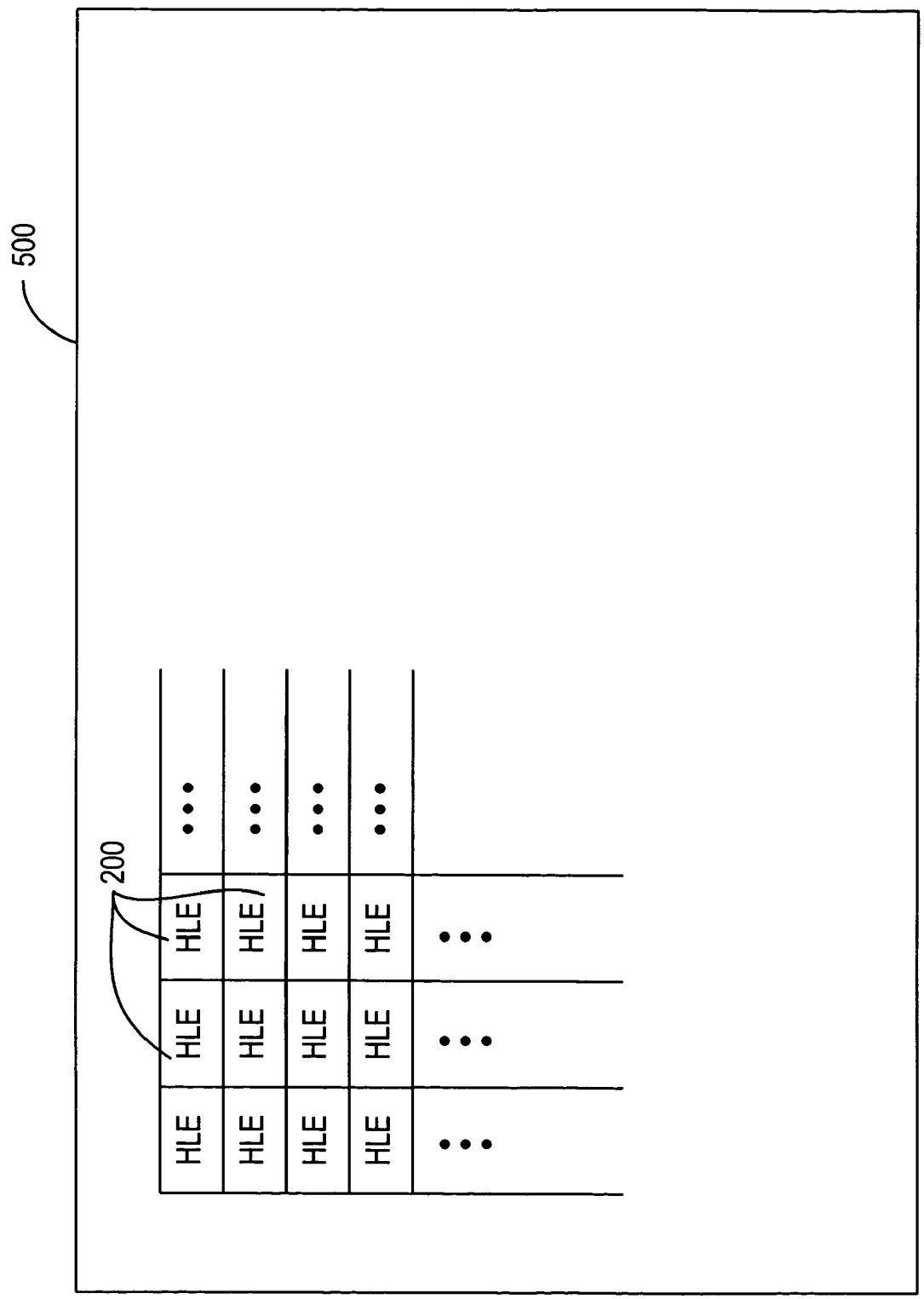
FIG. 15 is a simplified block diagram showing an illustrative arrangement of HLEs on an ASIC in accordance with the invention.

FIG. 15 shows an illustrative arrangement of HLEs 200 on an integrated circuit device 500. HLEs 200 in FIG. 15 may be constructed as shown in FIG. 3 or any other FIG. herein, or they may include any of the modifications referred to anywhere in this specification. In the illustrative arrangement shown in FIG. 15, HLEs 200 are disposed on device 500 in a two-dimensional array of intersecting rows and columns. Device 500 may also include other circuitry such as I/O blocks, memory blocks, etc. (not shown). ASICs in accordance with this invention are therefore preferably "structured ASICs" in the sense that they have a basic circuit organization or structure (e.g., the above-mentioned two-dimensional array of HLEs as shown in FIG. 15), to which customizable modifications and/or additions are made (e.g., interconnections within and/or among the HLEs). If device 500 is to be used as an ASIC equivalent of an FPGA, device 500 can generally be provided with a total number of HLEs 200 that is less than the number of LEs on the FPGA times the maximum number of HLEs 200 required to reproduce all the capabilities of one FPGA LE. This is so because only as many HLEs are used to perform the function(s) of each FPGA LE as are required, and in many cases fewer than the maximum number of HLEs are needed for this purpose. Certain aspects of this point will become even clearer as the description proceeds.

Figure 16:
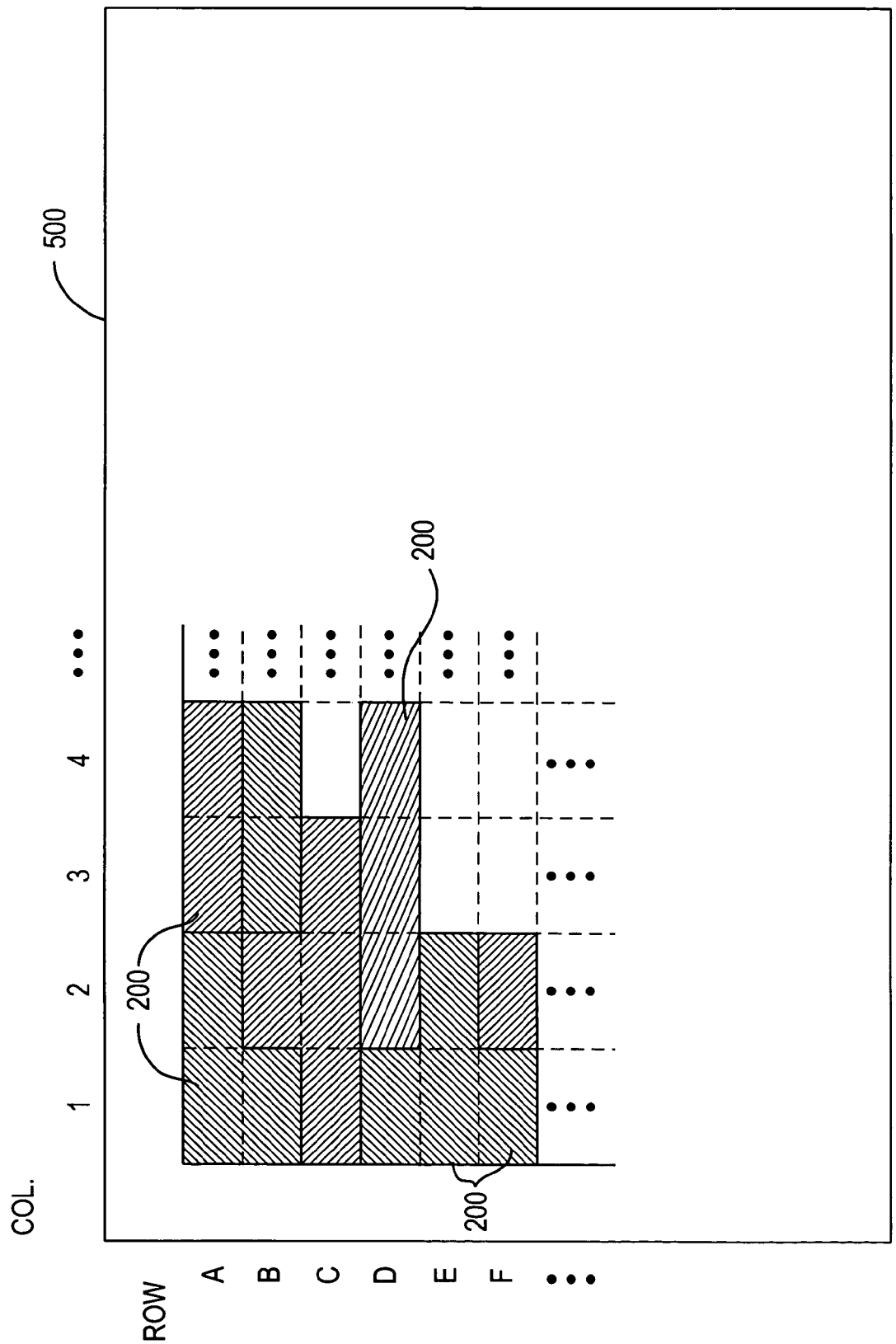
FIG. 16 is a simplified block diagram showing an example of use of HLEs on an ASIC in accordance with the invention.

FIG. 16 shows how HLEs 200 on device 500 may be used singly or together in groups to perform the function(s) of the LEs in an equivalent FPGA. In FIG. 16 adjacent or nearby HLEs 200 that are used together are shaded the same way, which is different than the shading used for other adjacent or nearby HLEs. To facilitate reference, the HLE columns in FIG. 16 are numbered 1, 2, 3, etc., and the HLE rows are lettered A, B, C, etc. Using these row and column references, FIG. 16 shows HLEs being used together as follows:

Group 1: A1/A2/B1
Group 2: A3/A4
Group 3: B2/C1/C2/C3
Group 4: B3/B4
Group 5: D1/E1/E2/F1
Group 6: D2/D3/D4
Group 7: F2

The above groupings might be performing the functions of LEs in an equivalent FPGA as follows:

Group 1: Combinational logic of FPGA LE A1
Group 2: Register function of FPGA LE A1
Group 3: Combinational logic of FPGA LE B1
Group 4: Register function of FPGA LE B1
Group 5: Combinational logic of FPGA LE C1
Group 6: Combinational logic of FPGA LE D1
Group 7: Combinational logic of FPGA LE E1

In the immediately above list, row letters and column numbers (like those shown in FIG. 16) are used to reference LEs in a two-dimensional FPGA LE array.

It will be understood that the example of HLE groupings shown in FIG. 16 is only illustrative, and that many other groupings are equally possible. The actual groupings employed in any particular case (ASIC) will be dictated by the FPGA LE functions that need to be equivalently performed in that ASIC device 500. However, one preference suggested by the illustrative listings in the two preceding paragraphs is the following. It can be desirable for the functions of the FPGA LES to be implemented in the same general arrangement of ASIC HLEs. For example, one or more functions performed by an LE near the upper left-hand corner of the FPGA are preferably performed by the required number of HLEs in a corresponding location (e.g., near the upper left-hand corner) of the ASIC.

It should also be mentioned in connection with FIG. 16 that some HLEs 200 in ASIC 500 may be unused.

Figure 17:
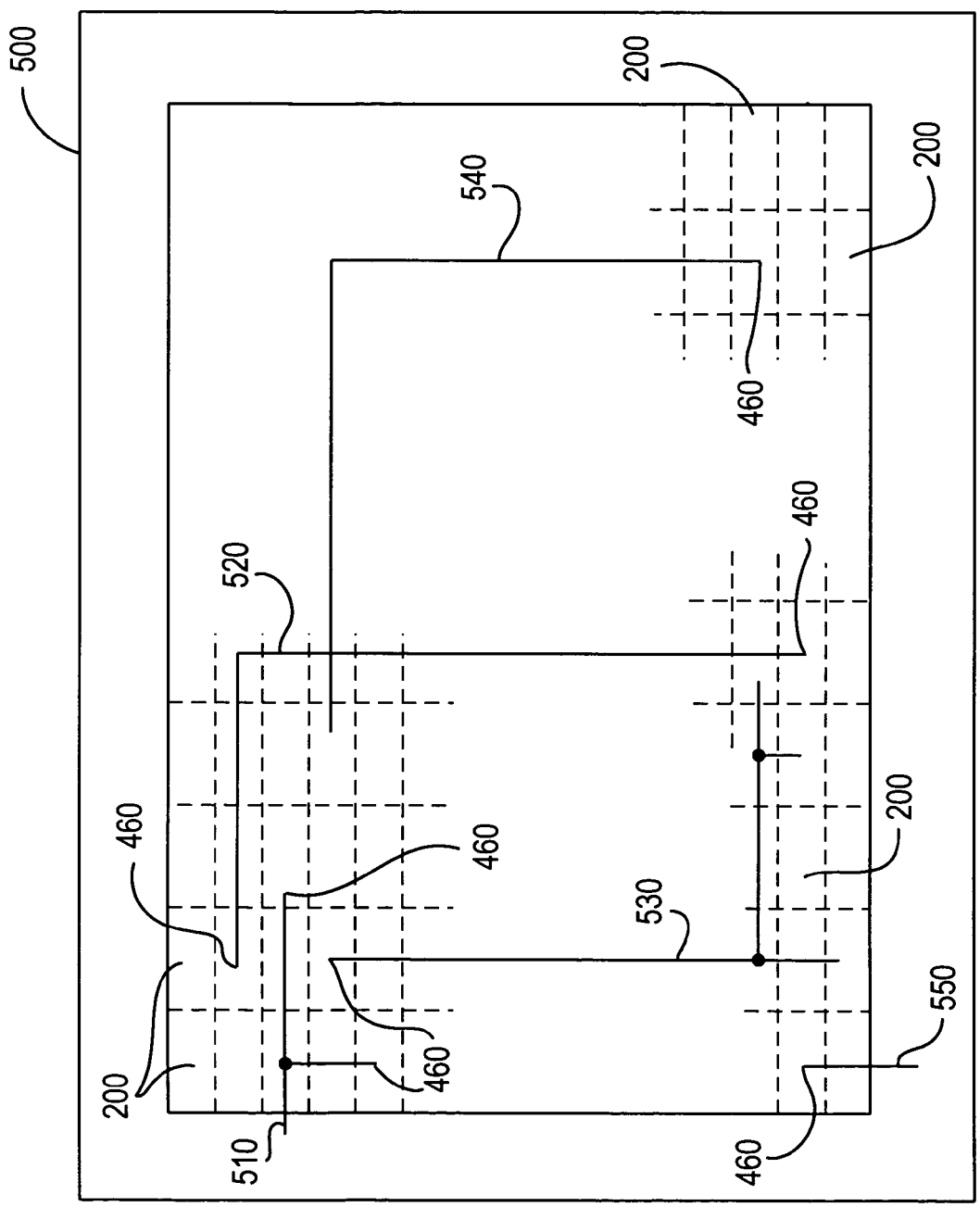
FIG. 17 is a simplified schematic block diagram showing an example of additional programmable interconnection circuitry on an ASIC in accordance with the invention.

For completeness, FIG. 17 shows some illustrative higher-level interconnection circuitry 510, 520, 530, 540, and 550 on an ASIC 500. For example, circuitry 520 may be provided (on an ASIC-customized basis) for making a connection from an I/O port 460 (e.g., an output) of an HLE 200 near the upper left-hand corner of ASIC 500 to an I/O port 460 (e.g., an input) of another HLE 200 near the bottom-center of the ASIC. As another example, circuitry 550 may be provided (on an ASIC-customized basis) for making a connection from an I/O port 460 (e.g., an output) of an HLE 200 near the lower left-hand corner of ASIC 500 to an output port (not shown) of the ASIC. Two layers of customizable metal (and intervening customizable vias) may be needed to provide non-blocking, higher-level routing to, from, and/or between HLEs 200 in any desired arrangement.

As is desirable in ASIC designs, the number of layers requiring customization (programming) in a device in accordance with the invention is preferably relatively small. Illustrative layers requiring customization in what has been described thus far are primarily the layer providing programmable vias 420/440 (FIGS. 4 and 6) between the horizontal and vertical interconnection conductors of the HLEs and the like, the layer providing programmable vias 470 (FIG. 8) for the I/O ports to the higher level interconnection circuitry, and the layer(s) providing the higher level interconnection circuitry itself. (Alternatively, all I/O port vias 470 can always be present and either connected to higher level interconnection circuitry if needed (used), or bypassed by that circuitry if not needed (not used).)

An important advantage of the present invention is the fact that the function(s) of any FPGA LE can be readily mapped to one or more ASIC HLEs (and vice versa). This makes it possible to provide an HLE-based ASIC equivalent of any user's programmed or configured FPGA (or vice versa) without re-synthesis of the user's logic at any level (apart from the easy re-mapping mentioned in the preceding sentence). This contrasts favorably with what most structured ASIC vendors offer as FPGA equivalents. Typically such vendors use complex multi-gate or gate array designs to construct the logic fabric. Because the building blocks of these logic fabrics tend to be unlike FPGAs, re-synthesis is required when using FPGAs for prototyping. This inflexibility adds verification effort to make sure the design prototyped in an FPGA is functionally equivalent to the one to be fabricated in the structured ASIC. Re-synthesis of the logic is similarly required if it is desired to produce a programmed FPGA that is equivalent to such a structured ASIC. The present invention avoids such re-synthesis when migrating in either direction between a configured FPGA and an HLE-based ASIC. In addition, HLEs save space as compared to ASIC LEs that are structurally similar to FPGA LEs (because for each FPGA LE only as many HLEs are used as are required to perform the function(s) of the corresponding programmed FPGA LE).

Figure 18:
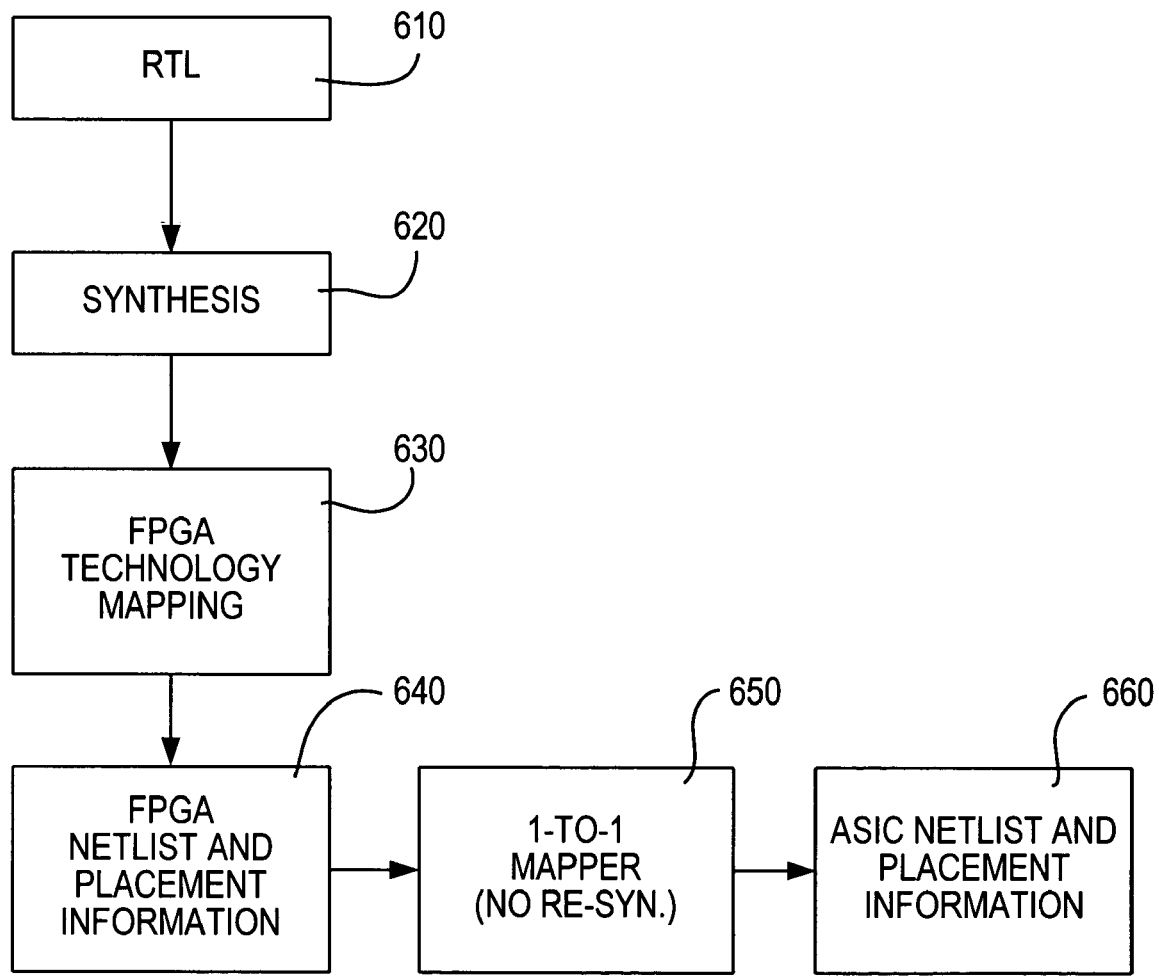
FIG. 18 is a flow chart for illustrative methods in accordance with the invention.

FIG. 18 shows an illustrative series of flow elements (i.e., steps and/or results) that can be used to produce designs for equivalent LE-based FPGAs and HLE-based ASICs. FIG. 18 illustrates producing an FPGA design first, and then producing a substantially equivalent ASIC design from that FPGA design. The desired logic (and possibly other functions) that a user has specified is presented in flow element 610, typically in some standard form such as RTL (register transfer level). In flow element 620, the RTL is synthesized from the relatively generic specification provided in flow element 610 to a form that lends itself to implementation in FPGAs having particular characteristics (e.g., LEs including 4-LUTs and registers, etc.). Flow element 620 can be performed using commercially available FPGA synthesis software tools such as the Quartus II product offered by Altera Corporation of San Jose, Calif. The result of synthesis 620 is then mapped to a particular FPGA technology in flow element 630.

The next flow element 640 is conversion of the FPGA technology mapping to netlist and placement information for a particular FPGA within the general FPGA technology contemplated in flow element 630. For example, flow element 640 works within the context of an FPGA having a particular number and arrangement of resources. Flow element 640 specifies which of these resources will perform each and every function the user's design requires. FPGAs of the specified kind can be programmed from the information generated in flow element 640 via a bitstream.

To produce an HLE-based ASIC substantially equivalent to an FPGA programmed from information 640, step 650 is performed on the 640 information in accordance with this invention. Step 650 is a 1-to-1 mapping of functional units in the 640 information to one HLE or one group of HLEs that can minimally perform that functional unit. In the context of the examples discussed earlier in this specification, a functional unit is either the combinational logic performed by the LUT in a given FPGA LE, or the register in a given FPGA LE. If the functional unit is combinational logic, step 650 maps that logic to the smallest number of HLEs that can perform that function. This preferably includes using logic reduction as mentioned earlier to reduce the number of selection levels required. Other techniques may also be used to simplify (optimize) the logic for implementation in HLEs. If the functional unit is a register, step 650 maps that register to two HLEs, e.g., as shown in FIG. 13. Step 650 also selects which HLEs will perform which of the functional units, and how each HLE should be configured to enable it to perform its role in implementing the functional unit it is assigned to. For example, step 650 preferably preserves the general arrangement of functions on the FPGA in locating those functions on the equivalent ASIC (but preserving the general location is not required, and the equivalent HLE(s) can be placed in other parts of the target ASIC). Step 650 also specifies the higher-level routing that will be required to provide needed connections to, from, and/or between the HLEs or HLE groups that cannot be provided at the lower, more direct, inter-HLE level. It is assumed that step 650 is working in the context of an ASIC having sufficient capacity to implement the functions specified in the starting FPGA.

The result 660 of step 650 is ASIC netlist and placement information that can be used to specify the masks needed to fabricate an ASIC that will function equivalently to the starting FPGA (specified by the 640 information). Advantageously, the 660 information has been derived directly from the 640 information. No re-synthesis of the user's starting logic specification (e.g., as in step 620) has been required to perform this FPGA-to-ASIC conversion. There should accordingly be no defect in the equivalency between FPGAs and ASICs produced according to the FIG. 18 steps and results.

Figure 19:
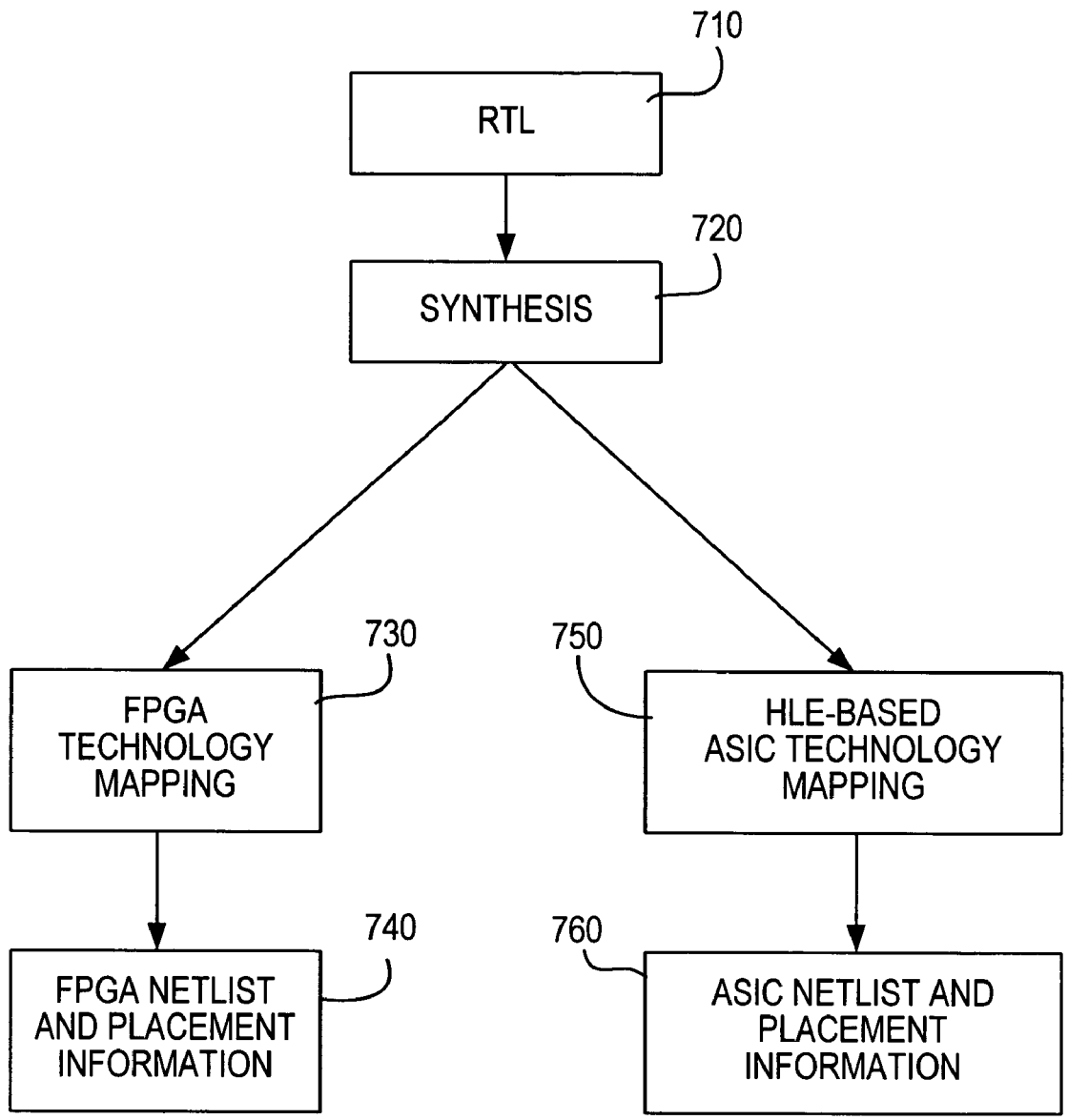
FIG. 19 is another flow chart for illustrative methods in accordance with the invention.

FIG. 19 shows another technique in accordance with the invention for producing equivalent LE-based FPGAs and HLE-based ASICs. Flow elements 710 and 720 are respectively similar to flow elements 610 and 620 in FIG. 18. The result of synthesis 720 that is keyed to a particular FPGA technology is used to produce both a mapping 730 of the user's logic design to an FPGA device or device class, and a mapping 750 of the user's logic design to an HLE-based ASIC device or device class. In other words, one common logic synthesis 720 is used as the basis for both of mappings 730 and 750. Logical equivalence of these two mappings is thereby assured. FPGA mapping 730 is used to produce netlist and placement information 740 for a particular FPGA design (i.e., programming or configuration). ASIC mapping 750 is used to produce a specification 760 for the programmable masks of a particular, mask-programmable, HLE-based ASIC. An FPGA produced from information 740 will be logically equivalent to an ASIC produced from information 760 and vice versa. For example, if only the ASIC version is produced at first, but either FPGA mapping 730 or FPGA information 740 from the initial synthesis 720 is retained, FPGAs equivalent to the ASIC can always be produced without logic re-synthesis by using either information 740 or mapping 730 (to produce information 740 again). The same is true for movement from a first-produced FPGA to a later-needed equivalent ASIC, assuming retention of the initially produced mapping 750 or information 760. The ASIC can be produced at any time from either information 760 or mapping 750 (now used as the basis for producing information 760 again). No logic re-synthesis is required, and equivalence of the later-produced ASIC to the initially produced FPGA is assured.

Figure 20:
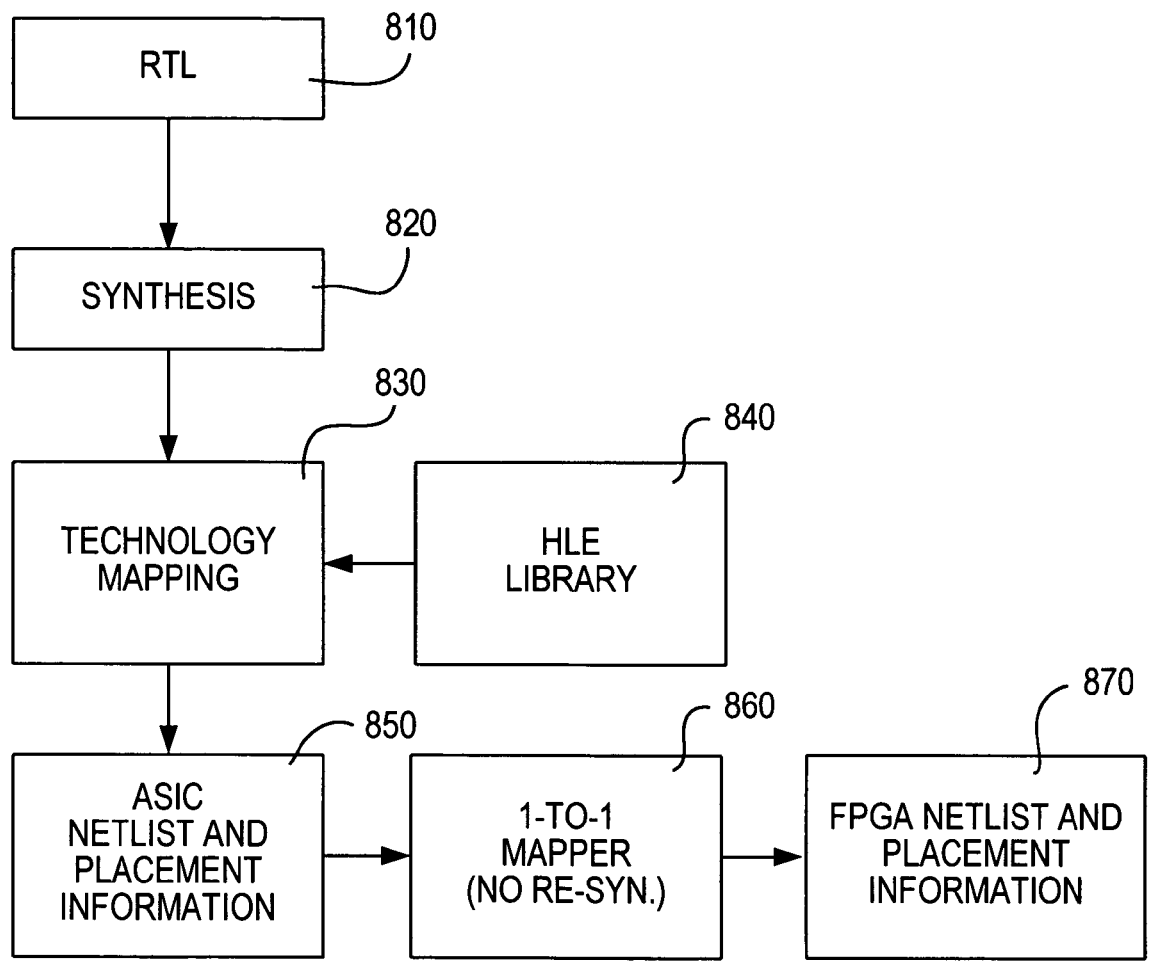
FIG. 20 is still another flow chart for illustrative methods in accordance with the invention.

FIG. 20 shows another technique in accordance with the invention for producing an LE-based FPGA from an already-produced HLE-based ASIC. Once again, flow elements 810 and 820 in FIG. 20 are respectively similar to flow elements 610 and 620 in FIG. 18 (or flow elements 710 and 720 in FIG. 19). Technology mapping 830 is keyed to an LE-based FPGA architecture, but it makes use of HLE library 840 to perform a step that takes the mapping from an FPGA LE basis to an HLE basis. Flow element 850 produces from mapping 830 a specification for the programmable masks of a mask-programmable, HLE-based ASIC. ASICs can be produced from this specification.

If an equivalent FPGA is needed later, it can be produced from information 850 as is further shown in FIG. 20. In flow element 860 information 850 is re-mapped from HLE-based form to LE-based form. This can be a 1-to-1 mapping of each HLE or group of HLEs that was derived from an LE function in elements 830 and 840 back to the LE initially having that function. To facilitate this 1-to-1 mapping, information 850 may include a record of how its various parts were derived from starting LEs. No logic re-synthesis is required in flow element 860. From element 860, FPGA netlist and placement information 870 results and can be used to produce FPGAs that are logically equivalent to ASICs produced from information 850.

Although already at least implicit in the foregoing discussion, it is here expressly noted that technology mapping 830 is not free to assemble HLEs in any possible way to implement the user's logic design. To the contrary, mapping 830 is constrained to use HLEs only as implementations of functions that can be implemented in FPGA LEs. This makes possible the later 1-to-1 mapping 860 of information 850 back to LE-based form in element 870.

FIGS. 21*a–c*, 22*a–c*, and 23 show examples of the various ways in which the NAND array 220 and possible other elements 230 (or equivalent circuitry) in an HLE like that shown in FIG. 3 can be configured (e.g., by mask programming) in accordance with further aspects of the invention. FIGS. 21*a–c*, for example, show various ways that an inverter can be provided. In FIG. 21*a* one of NAND gates 220 is used with one of its inputs tied to logic 1. In FIG. 21*b*, one of inverters 230 is used. In FIG. 21*c* both of NAND gates 220*a* and 220*b* or both of inverters 230*a* and 230*b* are connected in parallel (by appropriately mask programming interconnection resources in the HLE) to effectively provide one larger inverter, e.g., for stronger output driving from the HLE.

FIGS. 22*a–c* shows several examples of how non-inverting buffers can be provided. In FIG. 22*a* NAND gates 220*a* and 220*b* are connected in series, with one input terminal of each NAND gate tied to logic 1. Again, the routing resources of the HLE are mask programmed to connect the NAND gates in series. In FIG. 22*b* inverters 230*a* and 230*b* are similarly connected in series. In FIG. 22*c* NAND gates 220*a* and *b* are connected in parallel in inverter configuration (e.g., as in FIG. 21*a*) to effectively provide one larger first inverter 220*a/b*, and inverters 230*a* and *b* are similarly connected in parallel to effectively provide one larger second inverter 230*a/b*. As in FIG. 21*c*, the effectively larger elements in FIG. 22*c* provide stronger output drive from the HLE.

FIG. 23 shows use of one of NAND gates 220*a* or 220*b* to provide a NAND function.

Among the motivations for selection of some of the various options shown in FIGS. 21–23 may be the need for different amounts of output drive from different HLEs in a device employing HLEs in accordance with the invention. A driver of a certain size is typically capable of driving a certain amount of parasitic loading. In an ASIC flow, it may be necessary or desirable to upsize the standard cell or metal programmable cell or insert another driver (buffer or inverter) to boost the driving strength if the amount of fanout is so large that the original driving cell is not capable of driving the load. This implies an increase in area due to upsizing or additional buffers/inverters. However, with HLE-based ASICs in accordance with this invention, it is readily possible to make use of unused elements (HLEs or portions of HLEs) to increase the driving strength (non-inversion or inversion), e.g., through the lower level programmable interconnection resources. The elements (e.g., 220 and/or 230) that may be used together in various configurations such as those exemplified by FIGS. 21–23 do not have to be in the same HLEs. They can instead be in adjacent or nearby HLEs.

As has already been mentioned, various techniques can be used to conserve the number of HLEs required to implement certain functions. Logic reduction, as mentioned above, is one example of such HLE-conserving techniques. Another example is the case of one HLE driving another HLE where the second HLE is configured as, illustratively, a 2-input NAND gate. If this happens, the ASIC flow can pack the NAND gate into the first HLE, thus cutting the number of HLEs from two down to one. There are many similar cases where an nth HLE can be packed into the (n−1)th HLE, the (n−1)th HLE packed into the (n−2)th HLE, etc., especially with the inclusion of inverters like 230 in FIG. 3. Other examples are !A AND B, A AND B, etc.

It will be understood that the foregoing is only illustrative of the principles of the invention, and that various modifications can be made by those skilled in the art without departing from the scope and spirit of the invention. For example, the FPGAs and ASICs referred to herein do not have to be pure FPGAs or ASICs, respectively. A device can be part FPGA or part ASIC and part something else (e.g., part FPGA and part ASIC). References herein to FPGAs and ASICs will be understood to refer to the FPGA or ASIC portions of such hybrid devices.

Although via programming is generally referred to herein (see, e.g., FIGS. 4–9) for logic construction and intra- and inter-HLE routing, it will be understood that other types of programming (e.g., programming using metal optional links, fuses, antifuses, CRAM control, Flash control, etc.) can be used instead or in addition if desired. If some of these other technologies are used, then above references to mask programming will also be understood to refer to these other programming technologies, which may be implemented other than by customized or partly customized masks. Similarly, although HLEs are generally described herein as performing functions equivalent to FPGA LEs, HLEs as shown herein are high density and high performance components. As such they can also be used to form high performance intellectual property ("IP") (e.g., digital signal processing ("DSP") blocks, microprocessors, or the like), memory, etc.

What is claimed is:

1. A method of designing an ASIC that is equivalent to an FPGA that has been programmed to implement a user's logic design, the FPGA having an architecture that includes a plurality of instances of identical logic elements (LEs), each of which has an LE architecture that includes a plurality of circuit elements, and each of which LEs has a maximum logic capability, the ASIC having an ASIC architecture that includes a plurality of instances of identical hybrid logic elements (HLEs), each of which has an HLE architecture that includes a plurality of circuit elements but that is different from the LE architecture or any portion of the LE architecture, and each of which HLEs has a maximum logic capability that is only a fraction of the maximum logic capability of one LE of the FPGA, multiple ones of the HLEs being usable together, if necessary, to perform substantially any of the functions that can be performed by any one of the LEs, comprising:

synthesizing the user's logic design;

mapping the synthesized logic design to an FPGA implementation of that design in which each of a plurality of portions of the synthesized logic design is implemented in a respective one of the LEs; and re-mapping each of said portions of the synthesized logic design to an ASIC implementation of that portion, the ASIC implementation of each such portion employing one or more of the HLEs.

2. The method defined in claim 1 wherein the mapping comprises:

generating FPGA netlist and placement information.

3. The method defined in claim 2 wherein the re-mapping is performed on the FPGA netlist and placement information.

4. The method defined in claim 3 wherein the re-mapping comprises:

generating ASIC netlist and placement information.

5. The method defined in claim 1 wherein the re-mapping comprises:

generating ASIC netlist and placement information.

6. An ASIC made using the method defined in claim 1.

7. The method defined in claim 1 wherein the re-mapping comprises:

use of HLEs that are adjacent to one another to perform functions of any LE that cannot be performed by one HLE.

8. The method defined in claim 1 wherein the re-mapping comprises:

employing logic reduction in re-mapping an FPGA LE'S functions to one or more HLEs.

9. The method defined in claim 1 wherein the re-mapping comprises:

further re-mapping (1) logic functions and (2) register functions of each FPGA LE to respective different HLEs or groups of HLEs.

10. A method of designing an FPGA that is equivalent to an ASIC having an architecture that includes a plurality of instances of identical hybrid logic elements (HLEs), the FPGA having an architecture that includes a plurality of instances of identical logic elements (LEs), each of which has an architecture that includes a plurality of circuit elements, and each of which LEs has a maximum logic capability, each HLE having an HLE architecture that includes a plurality of circuit elements but that is different from the LE architecture or any portion of the LE architecture, and each of which HLEs has a maximum logic capability that is only a fraction of the maximum logic capability of one LE of the FPGA, multiple ones of the HLEs being usable together, if necessary, to perform substantially any of the functions that can be performed by any one of the LEs comprising:

synthesizing a user's logic design;
identifying a plurality of portions of the synthesized logic design, each of which portions can be implemented in one of the LEs;
mapping each of the portions of the synthesized logic design to an ASIC implementation of that portion, which ASIC implementation uses one or more of the HLEs;
retaining information as to which of the HLEs are used for the ASIC implementation of each of the portions; and
re-mapping the HLEs that are used for the ASIC implementation of each of the portions to an FPGA implementation of that portion, which FPGA implementation uses one of the LEs.

11. The method defined in claim 10 wherein the mapping comprises:
generating ASIC netlist and placement information.

12. The method defined in claim 11 wherein the re-mapping is performed on the ASIC netlist and placement information.

13. The method defined in claim 12 wherein the re-mapping comprises:
generating FPGA netlist and placement information.

14. The method defined in claim 10 wherein the re-mapping comprises:
generating FPGA netlist and placement information.

15. An FPGA made using the method defined in claim 10.

16. The method defined in claim 10 wherein the mapping comprises:
use of HLEs that are adjacent to one another to perform functions of each of the portions of the synthesized logic design that cannot be performed by one HLE.

17. The method defined in claim 10 wherein the mapping comprises:
employing logic reduction in the use of HLEs to perform functions of at least some of the portions of the synthesized logic design.

18. The method defined in claim 10 wherein the mapping comprises:
further mapping any (1) logic functions and (2) register functions of each of the portions of the synthesized logic design to respective different HLEs or groups of HLEs.

* * * * *